United States Patent
Tambe

(10) Patent No.: US 8,139,358 B2
(45) Date of Patent: Mar. 20, 2012

(54) APPARATUS FOR EXTERNALLY CHANGING THE DIRECTION OF AIR FLOWING THROUGH ELECTRONIC EQUIPMENT

(75) Inventor: Atul Tambe, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 12/674,065

(22) PCT Filed: Sep. 25, 2008

(86) PCT No.: PCT/US2008/077598
§ 371 (c)(1),
(2), (4) Date: Feb. 18, 2010

(87) PCT Pub. No.: WO2009/042735
PCT Pub. Date: Apr. 2, 2009

(65) Prior Publication Data
US 2011/0096498 A1 Apr. 28, 2011

Related U.S. Application Data

(60) Provisional application No. 60/975,138, filed on Sep. 25, 2007.

(51) Int. Cl.
*H05K 7/20* (2006.01)
(52) U.S. Cl. ............... 361/695; 361/679.49; 361/679.5; 165/104.33; 165/122; 454/184
(58) Field of Classification Search .. 361/679.46–679.5, 361/688, 689, 690–697, 715, 727; 165/80.3, 165/104.33, 121–126, 185; 454/184; 174/16.1, 174/16.3, 252
See application file for complete search history.

(56) References Cited

U.S. PATENT DOCUMENTS

| | | | | |
|---|---|---|---|---|
| 3,192,306 A | * | 6/1965 | Skonnord | 174/16.1 |
| 4,158,875 A | * | 6/1979 | Tajima et al. | 361/695 |
| 4,489,363 A | * | 12/1984 | Goldberg | 361/693 |
| 4,674,704 A | * | 6/1987 | Altoz et al. | 244/1 R |
| 4,751,872 A | | 6/1988 | Lawson | |
| 4,901,200 A | * | 2/1990 | Mazura | 361/678 |
| 5,422,787 A | | 6/1995 | Gourdine | |
| 5,497,288 A | | 3/1996 | Otis et al. | |
| 5,673,029 A | | 9/1997 | Behl et al. | |

(Continued)

OTHER PUBLICATIONS

International Search Report and Written Opinion for PCT/US2008/077598 dated Dec. 4, 2008; 8 pages.

*Primary Examiner* — Michail V Datskovskiy
(74) *Attorney, Agent, or Firm* — Guerin & Rodriguez, LLP

(57) ABSTRACT

A first conduit is externally attached to one of two opposing sidewalls of electronic equipment and a second conduit is externally attached to the other of the opposing sidewalls. Each conduit has an open end, a closed end, and a side having a vent that is aligned with a vent in the sidewall of the electronic equipment to which that conduit is attached. The first conduit takes air in through its open end, channels the air in a direction substantially orthogonal to the direction of air flowing through the electronic equipment, and directs the air into the electronic equipment through its aligned vents. The second conduit receives air from the electronic equipment through its aligned vents, channels the air in a direction that is substantially orthogonal to the direction of air flowing through the electronic equipment, and exhausts the air through the open end of the second conduit.

14 Claims, 14 Drawing Sheets

U.S. PATENT DOCUMENTS

| | | | |
|---|---|---|---|
| 6,151,210 A * | 11/2000 | Cercioglu et al. | 361/690 |
| 6,341,064 B1 | 1/2002 | Bradley | |
| 6,381,134 B2 * | 4/2002 | Iwasaki | 361/695 |
| 6,459,579 B1 | 10/2002 | Farmer et al. | |
| 6,496,366 B1 | 12/2002 | Coglitore et al. | |
| 6,574,100 B1 * | 6/2003 | Anderson | 361/679.5 |
| 6,611,428 B1 * | 8/2003 | Wong | 361/695 |
| 6,625,019 B1 * | 9/2003 | Steinman et al. | 361/695 |
| 6,628,520 B2 * | 9/2003 | Patel et al. | 361/696 |
| 6,643,123 B2 * | 11/2003 | Hartel et al. | 361/678 |
| 6,675,976 B2 * | 1/2004 | Steinman et al. | 211/26 |
| 6,704,196 B1 | 3/2004 | Rodriguez et al. | |
| 6,717,807 B2 | 4/2004 | Hikawa | |
| 6,924,981 B2 | 8/2005 | Chu et al. | |
| 6,982,872 B2 * | 1/2006 | Behl et al. | 361/679.31 |
| 6,995,978 B2 | 2/2006 | Strauss | |
| 7,016,194 B1 * | 3/2006 | Wong | 361/695 |
| 7,033,267 B2 * | 4/2006 | Rasmussen | 454/184 |
| 7,050,301 B2 * | 5/2006 | Wong et al. | 361/695 |
| 7,061,759 B2 * | 6/2006 | Karppinen et al. | 361/695 |
| 7,112,131 B2 | 9/2006 | Rasmussen | |
| 7,182,208 B2 * | 2/2007 | Tachibana | 211/26 |
| 7,397,661 B2 * | 7/2008 | Campbell et al. | 361/696 |
| 7,751,189 B2 * | 7/2010 | Ahuja et al. | 361/697 |
| 7,813,121 B2 * | 10/2010 | Bisson et al. | 361/679.51 |
| 2003/0076652 A1 * | 4/2003 | Ahn | 361/683 |
| 2003/0184961 A1 * | 10/2003 | Ahn | 361/683 |
| 2003/0235035 A1 | 12/2003 | Wintersteen et al. | |
| 2005/0225936 A1 | 10/2005 | Day | |
| 2006/0087813 A1 | 4/2006 | Becker et al. | |
| 2008/0113604 A1 * | 5/2008 | Tufford et al. | 454/187 |
| 2008/0239659 A1 * | 10/2008 | Kundapur | 361/687 |

\* cited by examiner

SIDE VIEW

END VIEW

APPARATUS FOR EXTERNALLY CHANGING THE DIRECTION OF AIR FLOWING THROUGH ELECTRONIC EQUIPMENT

RELATED APPLICATION

This utility application claims the benefit of U.S. Provisional Patent Application No. 60/975,138, filed on Sep. 25, 2007, the entirety of which is incorporated by reference herein.

FIELD OF THE INVENTION

The invention relates generally to a cooling apparatus for rack-mounted equipment.

BACKGROUND

Electronic equipment is often housed in a metal framework called an equipment rack. A typical equipment rack contains multiple bays, each holding a unit of electronic equipment, such as a server or a switch. Racks are generally available in standard sizes. Typically, each equipment unit occupies one of the bays and is secured to the rack with screws. To install a unit of equipment in a four-post rack, for example, a side rail is secured to each side of the unit of equipment. This assembly is then attached to the front and back vertical structural members of the rack, herein referred to as mounting rails.

An example of a rack 10 appears in FIG. 1. The rack 10 has a plurality of stacked units of electronic equipment 12. Cooling fans and other mechanical mechanisms (not shown) installed within the rack 10 move air in a direction designed to remove heat from the equipment housed within. Many racks produce front-to-back airflow, whereas many others produce back-to-front airflow.

Data centers typically have several racks of electronic equipment and often employ an overall cooling strategy based on a uniform airflow direction among its racks. Depending on a particular rack airflow strategy, the various units of electronic equipment in such a datacenter environment should have similar airflow direction. Notwithstanding an overall strategy, each unit of electronic equipment 12 housed within the rack 10 usually employs fans 16 to generate an internal airflow that cools the electronics housed within. These fans occupy a fixed position within the equipment and produce a particular airflow direction. Such airflow direction 18 may be from the front to the back of the equipment (FIG. 2A), from the back to the front (FIG. 2B), from side to side (FIG. 2C), or from side to back (FIG. 2D). The direction of airflow produced by any given unit of electronic equipment may not be consonant with the airflow direction produced by the rack. Once configured to provide a particular direction of airflow, though, the electronic equipment cannot change that direction of airflow without undergoing redesign.

Dissimilar directions of airflow produced by the rack and the various units of electronic equipment can produce an undesirable condition in which hot air circulates within the equipment rack. For example, as shown in FIG. 3, consider that the rack 10 exhausts hot air (arrows 20) at the back of the rack, whereas the electronic equipment 12 intakes air (arrow 22) from the back in accordance with its back-to-front airflow. Such a condition can cause the internal temperature of the equipment 12 to rise and, in extreme cases, render such equipment inoperable. However, if the electronic equipment is not suited for the airflow direction required in the rack, then a different unit of equipment is needed or the unit of equipment needs to be redesigned, which may be a costly venture that increases the price of the resulting product, rendering it competitively disadvantaged.

In addition, units of equipment employing a side-to-side cooling airflow generally cannot be installed in a rack employing a front-to-back cooling environment. For instance, as shown in FIG. 4, the installation of a unit of equipment 12 within the rack 10 often entails the use of a pair of side rails 28-1, 28-2 (generally, 28), one side rail along each sidewall of the rack 10. The sides of the unit of equipment 12 couple to these side rails 28. However, as illustrated in FIG. 5, the side rails 28 can obstruct the free flow of air moved into and out of the unit 12 by the fans 16 (the outline of the fans are drawn in dashed lines to show that the side rail 28 effectively covers them).

SUMMARY

In one aspect, the invention features an apparatus for changing a direction of a flow of air moving through an electronic equipment enclosure. The electronic equipment enclosure has a front wall, a back wall, opposing first and second sidewalls, and one or more fans that move air in a lateral direction through the electronic equipment enclosure. Each of the opposing sidewalls of the electronic equipment enclosure has one or more vents through which air enters or exits the electronic equipment enclosure. The apparatus comprises a first conduit attached externally to one of the opposing sidewalls of the electronic equipment enclosure. The first conduit has an open end, a closed end opposite the open end, and a side having one or more vents. The one or more vents in the side of the first conduit are aligned with the one or more vents in the sidewall of the electronic equipment enclosure to which the first conduit is attached. The first conduit takes air in through its open end, channels the air in a direction substantially orthogonal to the lateral direction of the air moving through the electronic equipment enclosure, and passes the air into the electronic equipment enclosure through the aligned vents. A second conduit is attached externally to the other of the opposing sidewalls of the electronic equipment enclosure. The second conduit has an open end, a closed end opposite the open end of the second conduit, and a side having one or more vents. The one or more vents in the side of the second conduit are aligned with the one or more vents in the sidewall of the electronic equipment enclosure to which the second conduit is attached. The second conduit receives the air moved through the electronic equipment enclosure by way of the one or more vents in the side of the second conduit, channels the air in a direction that is substantially orthogonal to the direction of the air moving through the electronic equipment enclosure, and exhausts the air through the open end of the second conduit.

In another aspect, the invention features an apparatus for changing a direction of air flowing through an electronic equipment enclosure having a front wall, a back wall, and opposing first and second sidewalls, and one or more fans moving air through the electronic equipment enclosure in a lateral direction. One of the opposing sidewalls of the electronic equipment enclosure has one or more vents through which air enters or exits the electronic equipment enclosure. The apparatus comprises a conduit attached externally to the one sidewall of the electronic equipment enclosure with the one or more vents, the conduit having an open end, a closed end opposite the open end, and a side having one or more vents, the one or more vents in the side of the conduit being aligned with the one or more vents in the sidewall of the electronic equipment enclosure to which the conduit is attached, the conduit channeling the air in a direction substantially orthogonal to the lateral direction of the air moving through the electronic equipment enclosure.

In still another aspect, the invention features a method of changing direction of an airflow moving through a unit of electronic equipment. The method includes externally attaching a first conduit to one of opposing sidewalls of the unit of electronic equipment and a second conduit to the other of the opposing sidewalls of the unit of electronic equipment. Each conduit has an open end, a closed end opposite the open end, and a side having one or more vents. The one or more vents in the side of each conduit are aligned with one or more vents in the sidewall of the unit of electronic equipment to which that conduit is attached. Air is taken in through the open end of the first conduit. The first conduit channels the air in a direction substantially orthogonal to the direction of the airflow moving through the unit of electronic equipment and directs the air into the unit of the electronic equipment through the aligned vents of the first conduit and the sidewall of the unit of the electronic equipment to which the first conduit is attached. The second conduit receives the air moved through the unit of electronic equipment through the aligned vents of the second conduit and the sidewall of the unit of the electronic equipment to which the second conduit is attached, channels the air in a direction that is substantially orthogonal to the direction of the air moving through the unit of electronic equipment, and exhausts the air through its open end.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

The present invention provides an external mechanical means for changing the overall direction of airflow moving through a unit of electronic equipment in order for the airflow direction to align with the airflow direction of an equipment rack (typically, front-to-back or back-to-front). The external mechanical means does not achieve the redirection of airflow by changing the operation of the fans or the airflow direction within the unit of electronic equipment or by requiring a retrofit of the unit—the invention may be used with "off-the-shelf" equipment. In brief overview, the external mechanical means includes a pair of conduits (or hollow tubes) that attach externally to opposite sides of a unit of electronic equipment. For example, if the equipment's fans produce side-to-side airflow within the electronic equipment, the external conduits can be configured to produce front-to-back or back-to-front airflow. In general, conduits of the present invention can be used to alter externally the intake direction, exhaust direction, or both, of any lateral airflow (i.e., side-to-side, side-to-front, front-to-side, side-to-back, and back-to-side) moving within the electronic equipment.

For example, for electronic equipment that moves air from side-to-side, one of the conduits receives cooling air through its open end and orthogonally redirects the air into side vents of the equipment. After passing through the unit (from side-to-side), the air enters the other conduit by passing through vents in the other conduit's side. The other conduit orthogonally redirects and exhausts the air through its open end. For units of equipment that employ side-to-back (or side-to-front) airflow, a single external conduit suffices to receive air from the front (or back) of the unit and redirect the air into the side of the unit. The unit itself exhausts the air through back (or front) vents.

In general, the hollow conduits of the present invention are closed at one end and open at the opposite end. They can have various cross-sectional shapes, for example, rectangular, square, and circular. The hollow interior of the conduits can have vanes or baffles that direct the airflow. The lengths of the conduits generally correspond to the length of the side of the unit of equipment to which they attach. In one embodiment, the conduit has symmetrical features so that it can be attached to either side of the unit with its open end facing either the front of the unit or the back. In some embodiments of the invention, the conduits are integrated in rack-mounting side rails, shelf side rails, and equipment trays.

Figure 1:
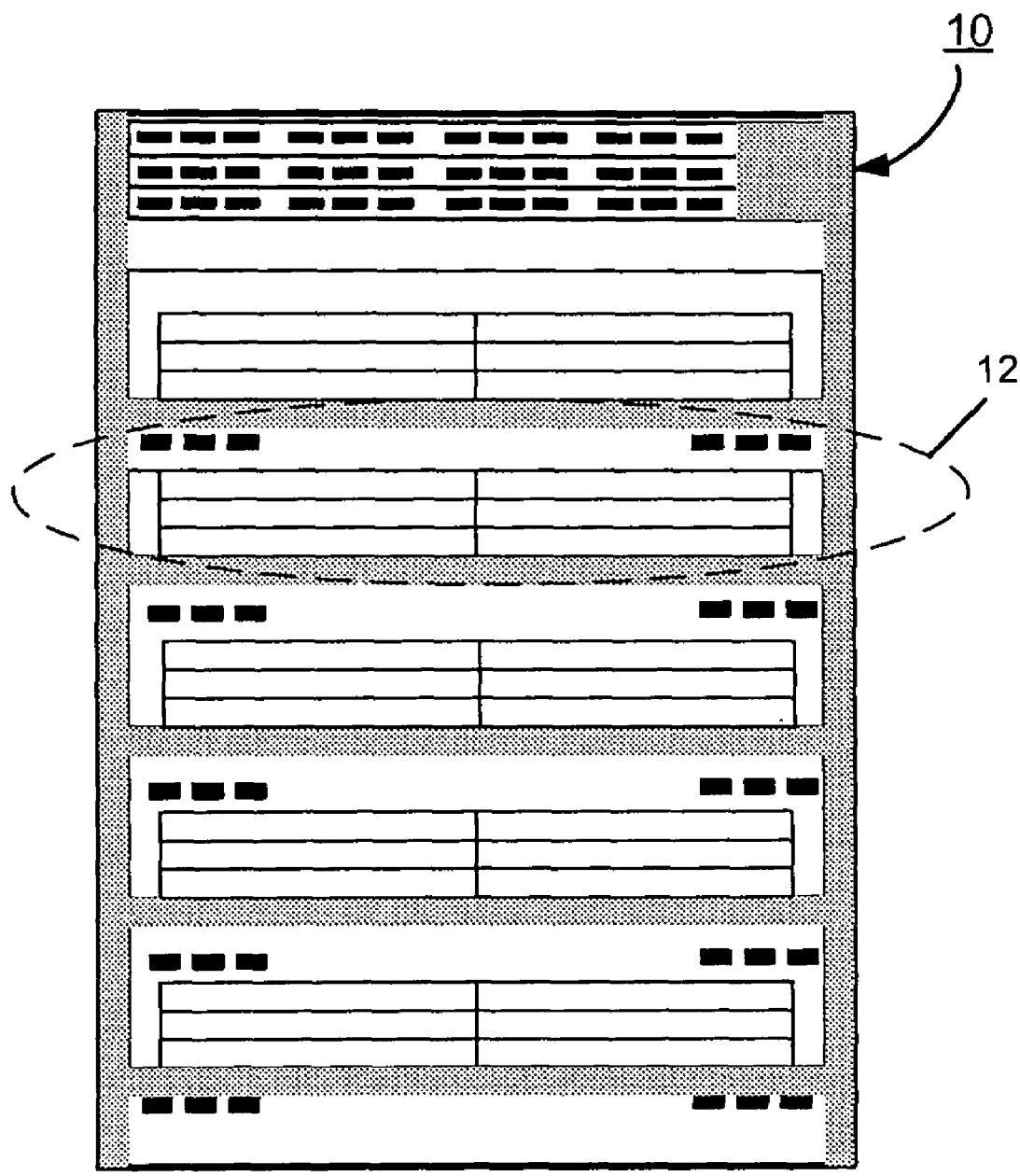
FIG. 1 is a front view of a rack that houses electronic equipment (e.g., a plurality of servers).
Figure 2A:
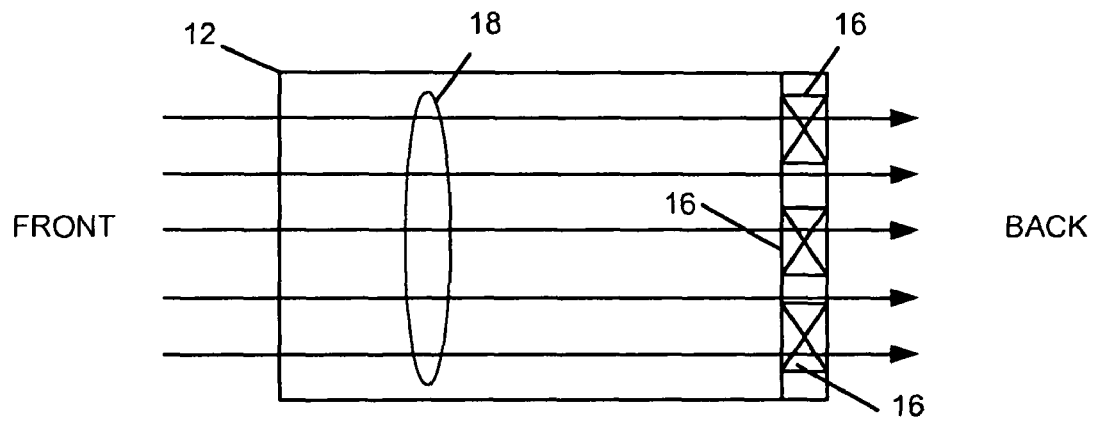
FIG. 2A, FIG. 2B, FIG. 2C, and FIG. 2D are top views of four different units of electronic equipment, illustrating four different airflow directions produced by fans operating within the units.
Figure 2B:
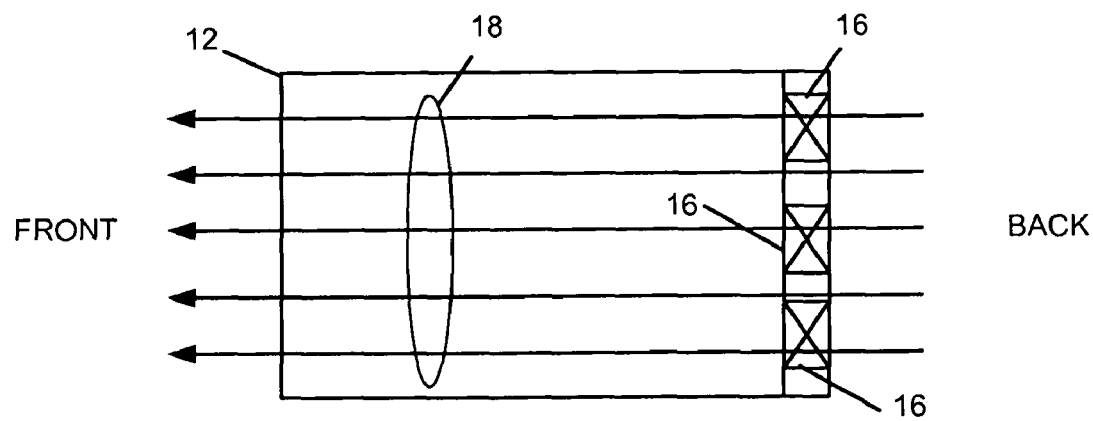
Figure 2C:
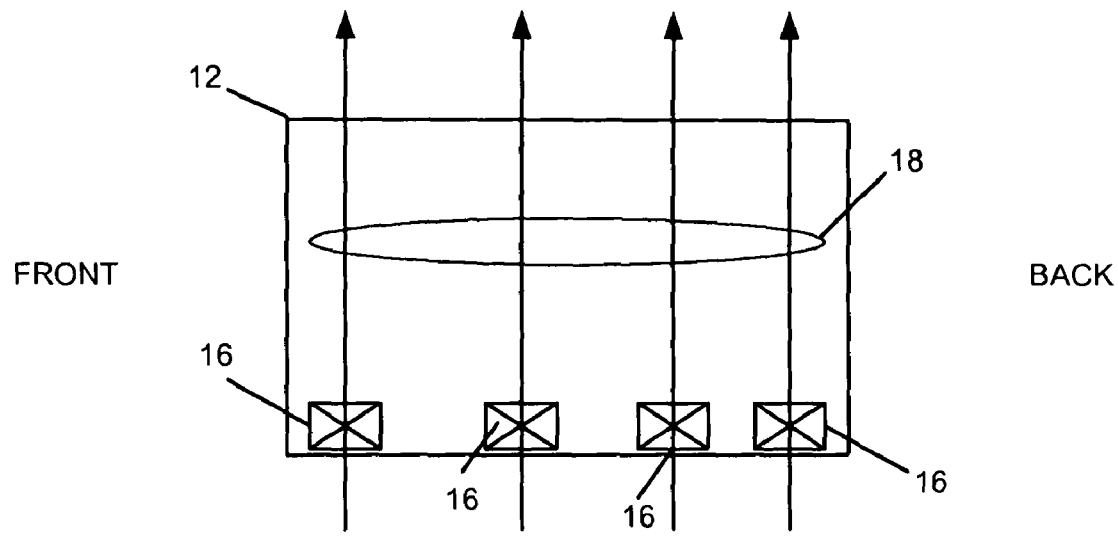
Figure 2D:
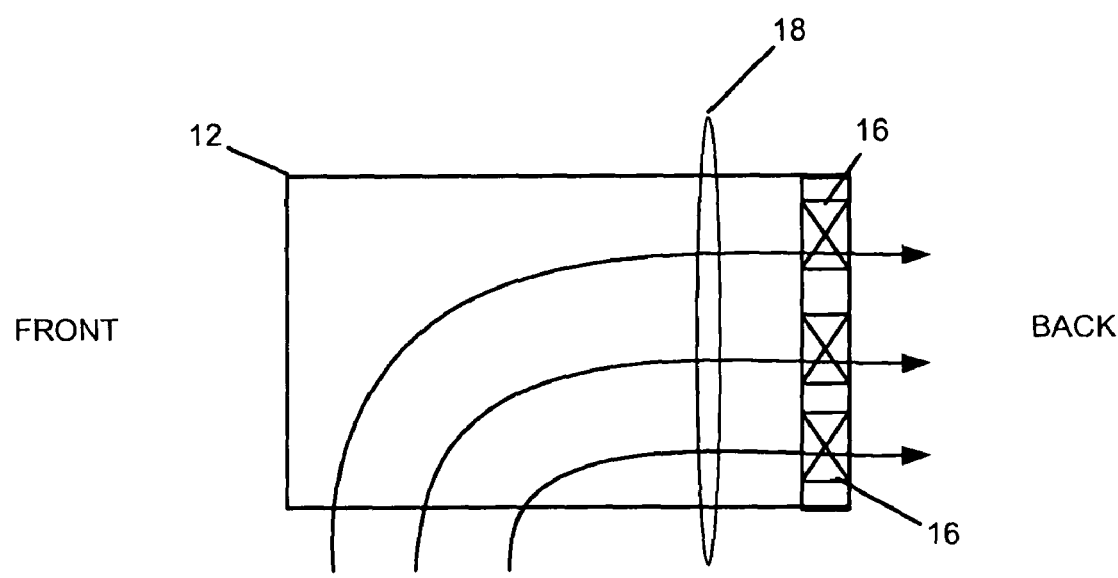
Figure 3:
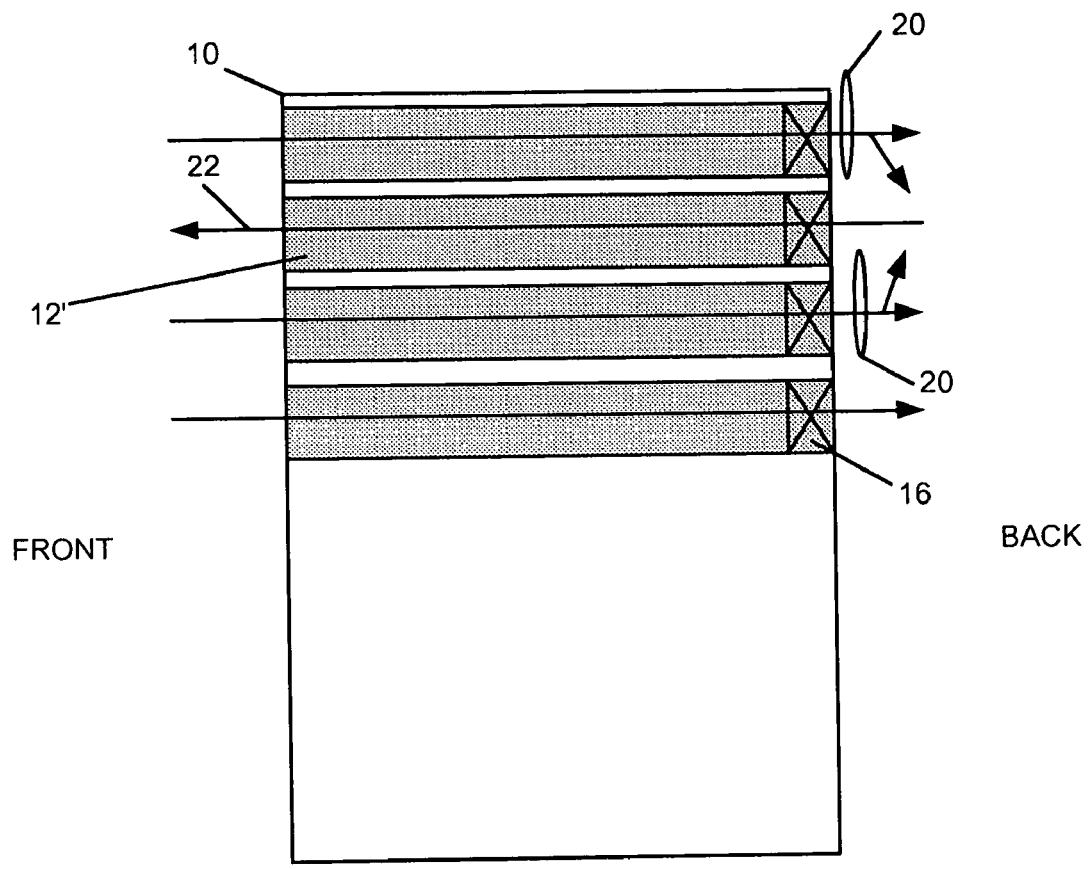
FIG. 3 is a diagrammatic representation of a potential airflow problem encountered in a rack.
Figure 4:
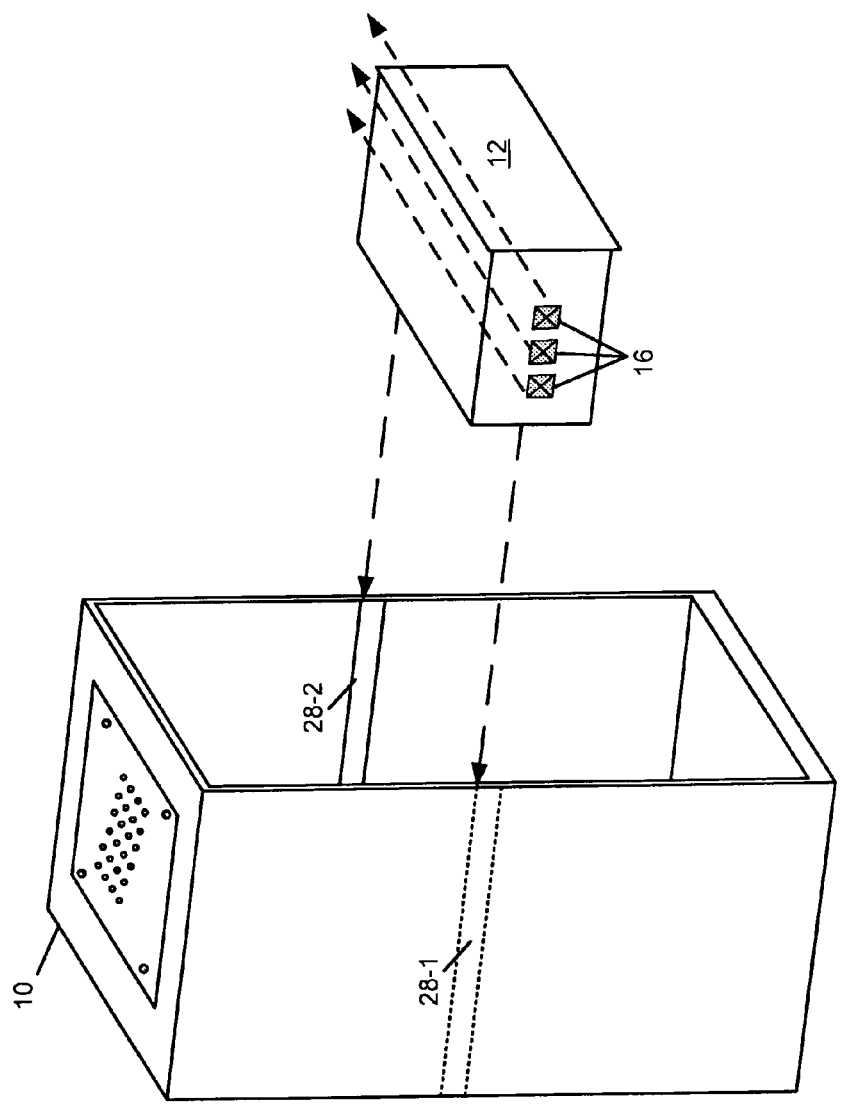
FIG. 4 is a diagrammatic representation of an installation of a unit of electronic equipment that employs side-to-side airflow within a compartment of the rack.
Figure 5:
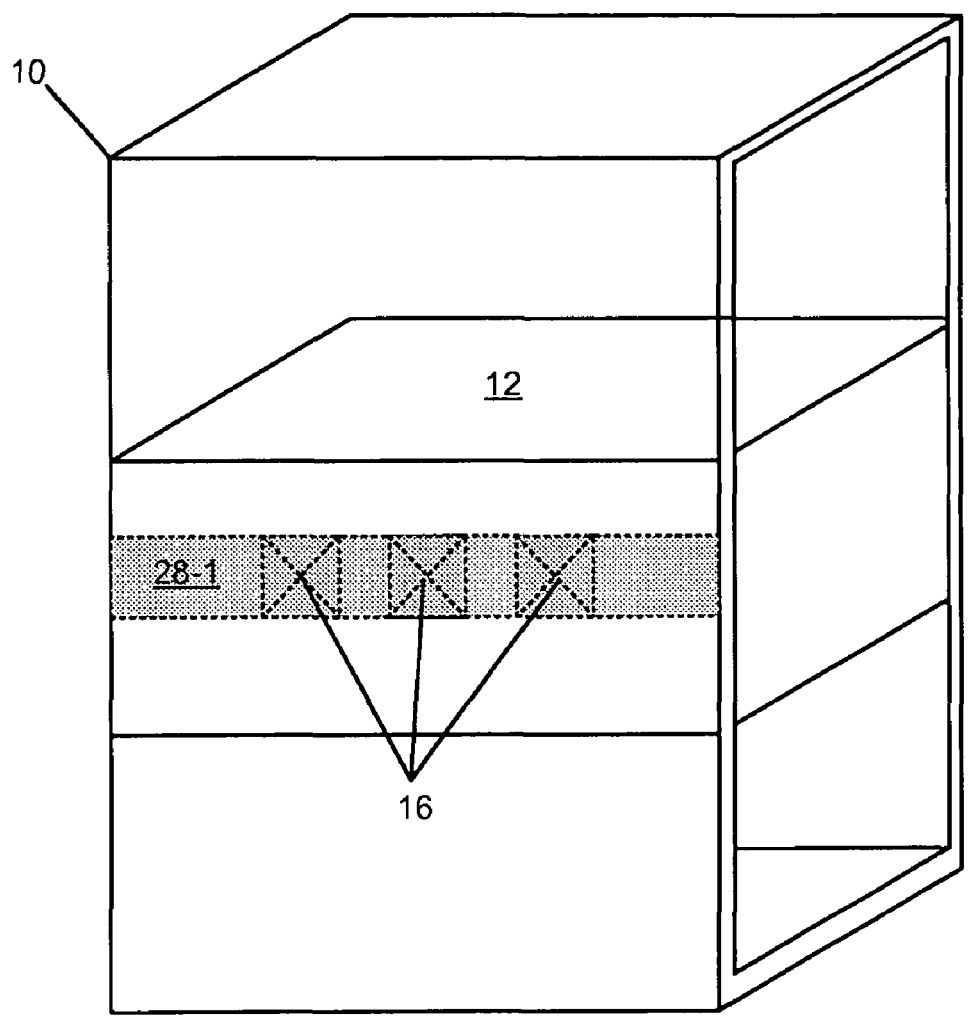
FIG. 5 is a diagrammatic representation of the installed unit of electronic equipment with side rails presenting an obstruction to the side-to-side airflow.
Figure 6:
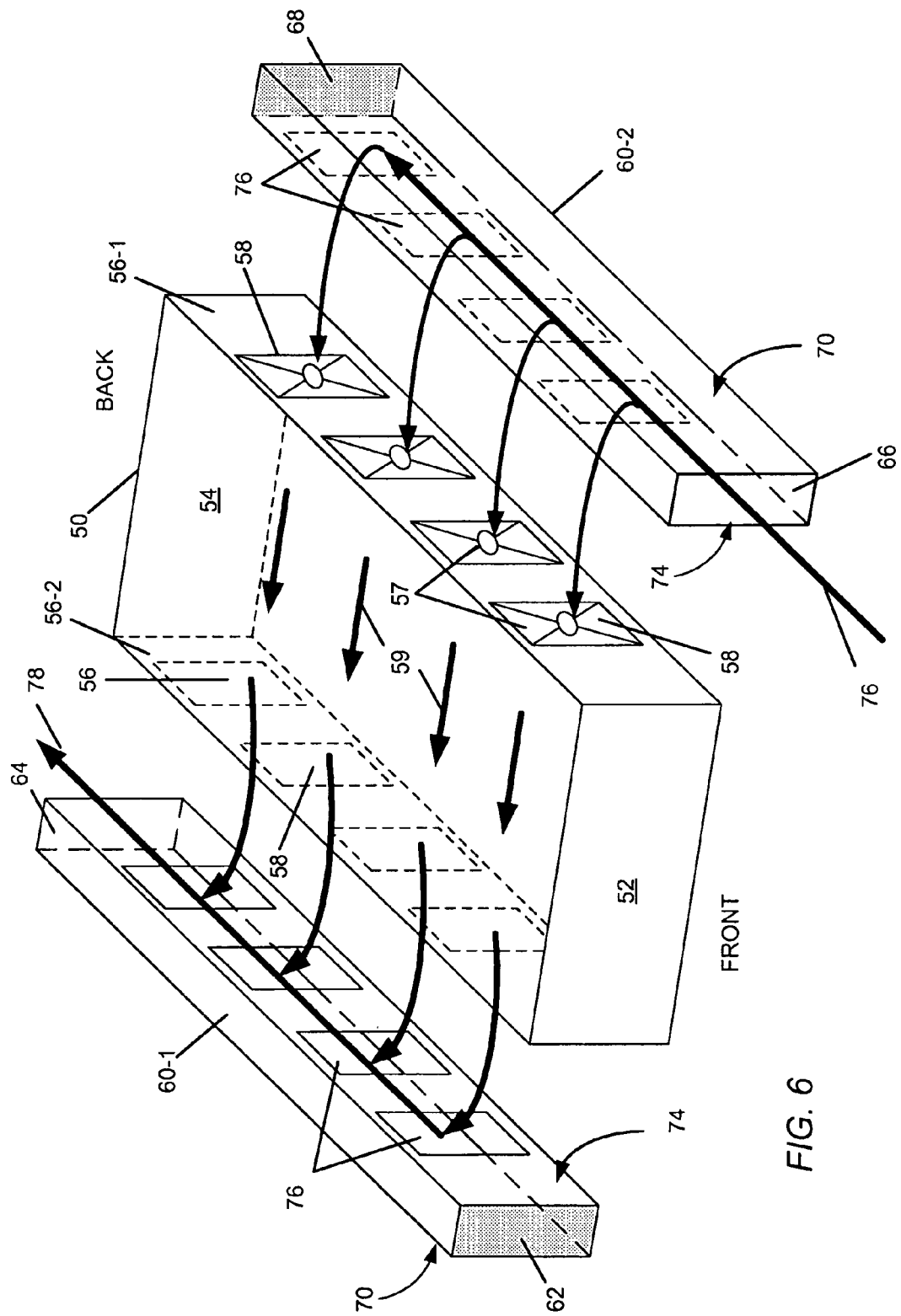
FIG. 6 is an exploded isometric view of an embodiment of a unit of electronic equipment employing side-to-side cooling airflow and a pair of conduits, one on each side of the unit, in accordance with the invention.

FIG. 6 shows an exploded view of an embodiment of an enclosed unit of electronic equipment 50 employing side-to-side cooling airflow and a pair of conduits 60-1, 60-2 (generally, 60). One conduit 60 is to be attached to each side of the unit 50. The unit of electronic equipment 50 has a front side 52, a back side 54, and opposing sidewalls 56-1, 56-2 (generally, 56). Each sidewall 56 has a plurality of vents 58. In this example, the vents 58 are rectangular. Vents can take on a variety of shapes and sizes. A single, large vent may be sufficient to exhaust or intake the amount of air needed to cool the electronics components in the box. Disposed adjacent the vents 58 of the sidewall 56-1 is a plurality of fans 57 that draws air into the unit 50 through the vents 58 and exhausts air through the vents 58 in the other sidewall 56-2 in accordance with a side-to-side airflow direction (as signified by arrows 59). Electronics within the unit 50 are not shown to simplify the illustration.

In this embodiment, the conduit 60-1 has a closed end 62 facing forward of the unit 50 and an open end 64 facing rearward of the unit 50, and the conduit 60-2 has an open end 66 facing forward of the unit 50 and a closed end 68 facing rearward of the unit 50. Each conduit 60 has a hollow interior bounded on one side by a first solid (i.e., without vents) side wall 70 and on an opposite side by a second side wall 72 with vents 74 formed therein. The locations of the vents 74 in the second side wall 72 are designed to align with the vents 58 in the sidewalls 56 of the unit of electronic equipment 50. If the conduit 60 has more vents 74 than the vents 58 in the equipment unit 50, an insert made of, for example, rubber or sheet metal can be used to plug any unused vent 74.

In this example configuration, the conduits 60 cooperate to convert the side-to-side airflow produced by the fans 57 of the unit 50 into a front-to-back airflow. During operation, air is drawn into the unit through the open end 66 of the conduit 60-2 (arrow 76) from the front of the unit, orthogonally redirected through the fans 57, blown laterally across the interior of the unit 50 through vents 58, 74 into the other conduit 60-1 (arrows 59), and then orthogonally redirected and exhausted through the open end 64 of the conduit 60-1 (arrow 78) at the back of the unit. Although the particular configuration shown in FIG. 6 converts side-to-side airflow of the unit 50 into front-to-back airflow, other configurations using two conduits can convert side-to-side airflow into back-to-front airflow, back-to-back airflow, or front-to-front airflow. Configurations using one conduit can convert side-to-back airflow into front-to-back airflow or back-to-back airflow and can convert back-to-side airflow into back- to-front or back-to-back airflow. Similarly, a single conduit can be used to convert side-to-front airflow into back-to-front airflow or front-to-front airflow, and front-to-side airflow into front-to-back airflow or front-to-front airflow.

Figure 7:
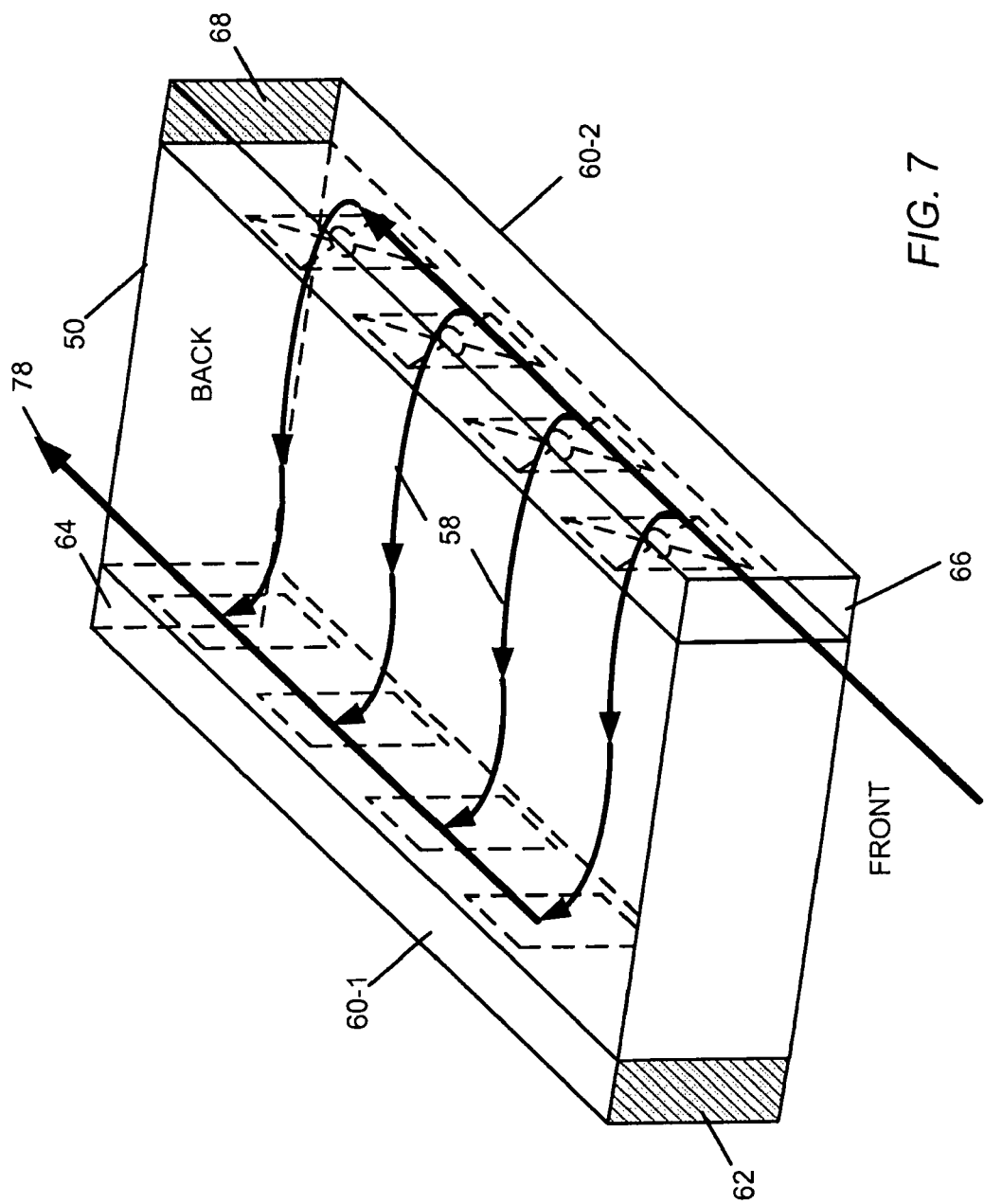
FIG. 7 an isometric view of the embodiment of the unit of electronic equipment of FIG. 6 with the pair of conduits attached to opposite sides of the unit in accordance with the invention.

FIG. 7 shows the unit of electronic equipment 50 (or unit 50) of FIG. 6 with the pair of conduits 60 attached to opposite sides of the unit 50. Various means for attachment may be used to attach the conduits 60 to the sides of the unit 50. As an example, the designed construction of the unit of electronic equipment 50 can be such that the unit 50 fits a standard dimensioned rack and has threaded holes in its side walls to receive screws for coupling the unit to side rails. In one embodiment, the conduits 60 have threaded through-holes that are positioned to align with these same threaded holes in the sidewalls of the unit 50, and threaded through-holes that are positioned to align with the holes in the side rails. With the conduits 60 interposed between the side rails and the unit 50, screws join the side rails to the conduits 60 and the conduits to the sidewalls of the unit 50. Other mechanisms may be used to attach the conduits to the sides of the unit 50 without departing from the principles of the invention.

Figure 8A:
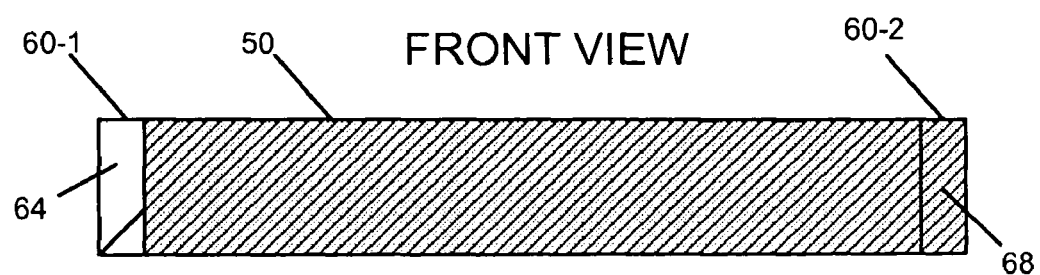
FIG. 8A and FIG. 8B are front views of the unit of electronic equipment illustrating that the conduit with the closed front end can be attached to either side of the unit.
Figure 8B:
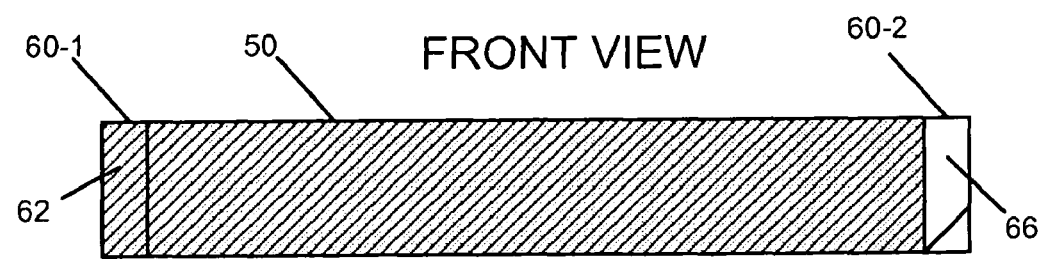

FIG. 8A and FIG. 8B show front views of the unit of electronic equipment 50 illustrating that the conduit with the closed front end can be attached to either side of the unit 50. The features of the conduit (i.e., locations of vents, gasket, mounting screw-holes) can be symmetrically arranged so that the conduit can be flipped vertically or horizontally in order to achieve the desired configuration for a particular side of the unit 50).

In FIG. 8A, the open end 64 of the conduit 60-1 and the closed end 68 of the conduit 60-2 face forward of the unit 50. Conversely, in FIG. 8B, the closed end 62 of the conduit 60-1 and the open end 66 of the conduit 60-2 face forward of the unit 50. Depending upon the direction in which the unit's fans move air through the unit 50, the open end of one conduit serves to intake air and the other to exhaust. In one embodiment, removable caps are used to close one end of each conduit.

Figure 9A:
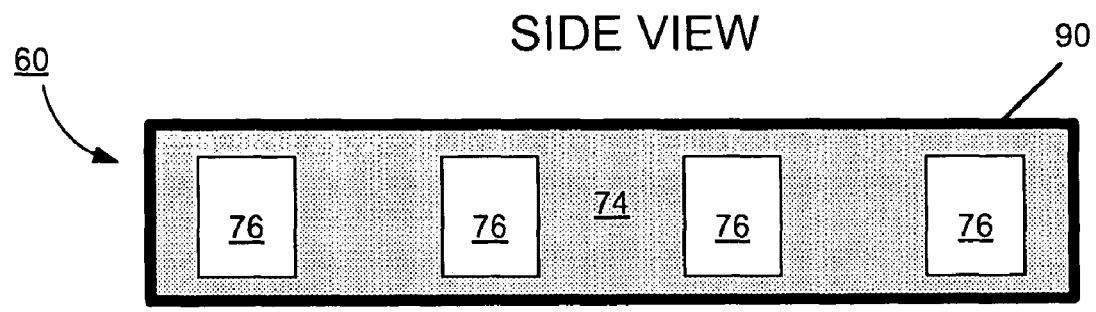
FIG. 9A and FIG. 9B are diagrammatic representations of an embodiment of a conduit of the invention having a gasket on one or both sides thereof.
Figure 9B:
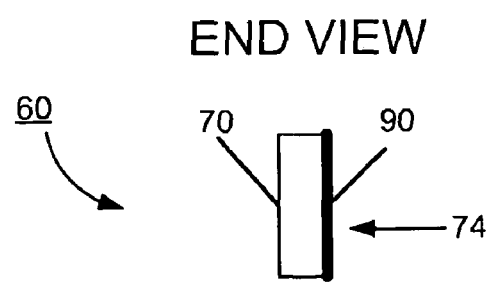

FIG. 9A shows a side view of an embodiment of the conduit 60 having a gasket 90 attached around its periphery. The gasket 90 operates to provide a seal between the side 74 of the conduit 60 and the sidewall 56 of the unit 50 to which the conduit is externally attached. The seal prevents air from escaping between the sidewall 56 and the side 74 of the conduit. FIG. 9B shows an end view of one embodiment of the conduit 60 with the gasket 90 on side 74 of the conduit 60.

Figure 10:
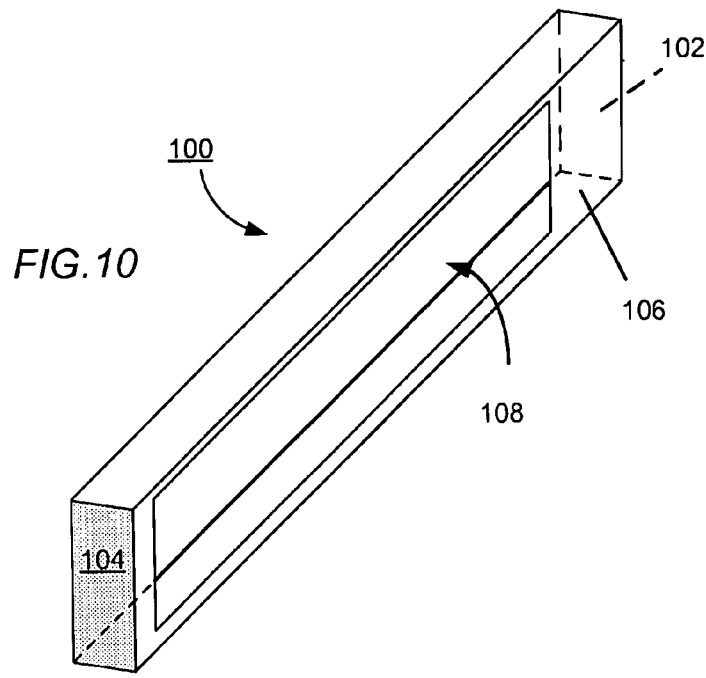
FIG. 10 is a diagrammatic representation of another embodiment of a conduit of the present invention.
Figure 11:
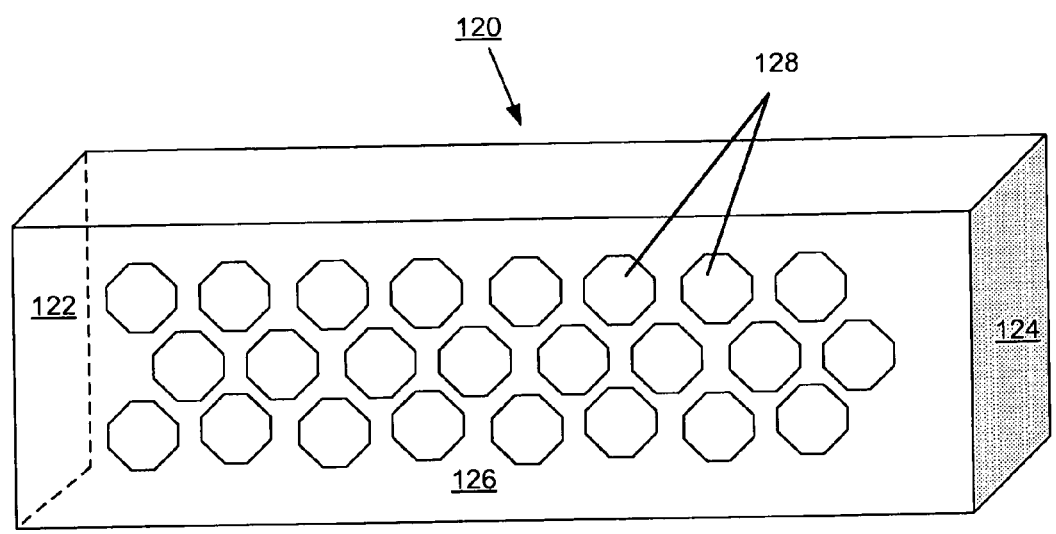
FIG. 11 is a diagrammatic representation of another embodiment of a conduit of the present invention.

FIG. 10 and FIG. 11 show other embodiments of conduits 100, 120 respectively, that can be attached externally to a sidewall 56 of a unit of equipment to redirect airflow in accordance with the invention. In FIG. 10, the conduit 100 has an open end 102, a closed end 104, and a side 106 with a single large vent 108 that spans much of the side 106. The side 106 with the vent 108 faces the sidewall 56 of the unit to which the conduit 100 attaches. In FIG. 11, the conduit 120 has an open end 122, a closed end 124, and a side 126 with a plurality of hexagonal vents 128 (i.e., "beehive pattern"). The side 126 with the vents 128 faces the sidewall 56 of the unit to which the conduit 120 attaches.

Figure 12:
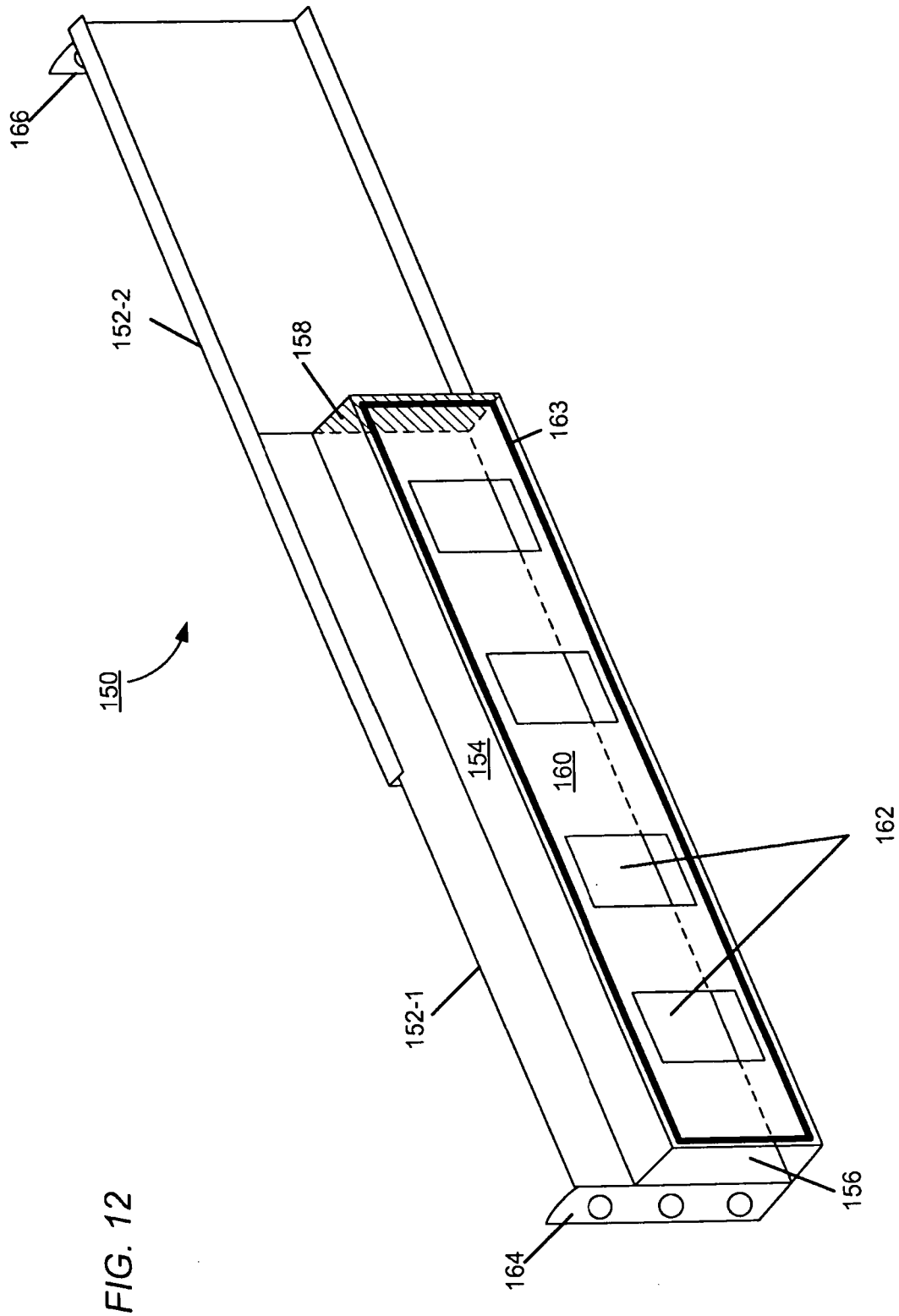
FIG. 12 is a diagrammatic representation of an embodiment of a mounting side rail constructed in accordance with the invention.

FIG. 12 shows an embodiment of a mounting side rail 150 constructed in accordance with the invention, for use in installing a unit of equipment in an equipment rack. The side rail 150 comprises two sections 152-1, 152-2. Section 152-1, which is slidably attached to section 152-2, has an integrated conduit 154 with an open end 156, a closed end 158, and a side 160 with a plurality of vents 162 formed therein. A gasket 163 extends around the periphery of the side 160. The locations of the open and closed ends 156, 158 are merely illustrative; instead of the configuration as shown, the open end 156 and closed end 158 can swap locations.

A flange 164 extends orthogonally from one end of the section 152-1, and a second flange 166 extends orthogonally from one end of the section 152-2. The flanges 164, 166 are used to secure the side rail 150 to two vertical rails of an equipment rack. The side rail 150 attaches to a left sidewall 56 of the unit of electronic equipment. Another side rail with an integrated conduit (not shown), constructed similarly to the side rail 150, attaches to a right sidewall 56 of the unit of electronic equipment.

Figure 13:
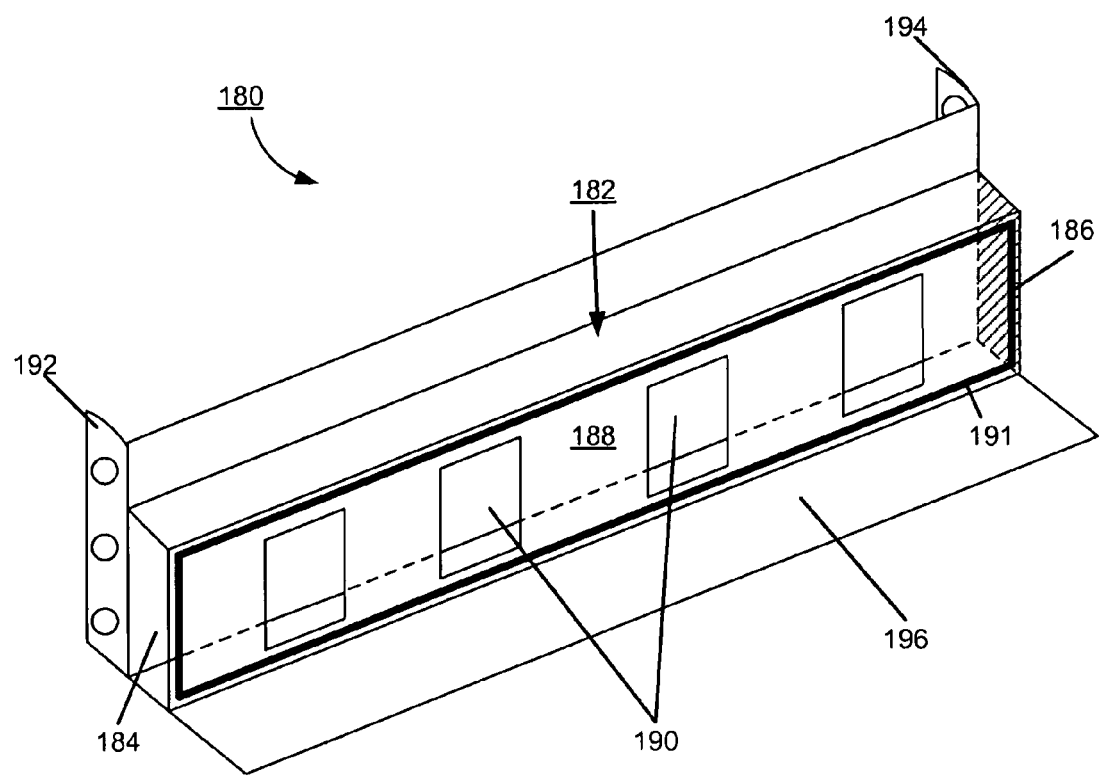
FIG. 13 is a diagrammatic representation of an embodiment of a shelf side rail constructed in accordance with the invention.

FIG. 13 shows an embodiment of a shelf side rail 180 having an integrated conduit 182 with an open end 184, a closed end 186, and a side 188 with a plurality of vents 190 formed therein. The locations of the open and closed ends 184, 186 are merely illustrative; instead of the configuration as shown, the open end 184 and closed end 186 can swap locations. A gasket 191 extends around the periphery of the side 190. A flange 192 extends orthogonally from a first end of the shelf side rail 180, and a second flange 194 extends orthogonally a second end of the shelf side rail 180. The flanges 192, 194 are used to secure the shelf side rail 180 to vertical rails of an equipment rack. A shelf portion 196 extends laterally from a bottom edge of the shelf side rail 180. Two shelf side rails attached to vertical rails of an equipment rack cooperate to support a unit of electronic equipment, with the unit sitting upon the shelf portions of the side rails. The shelf side rails 180 can also be securely mounted to the sidewalls 56 of the unit to produce a tight seal with the gasket 191.

Figure 14:
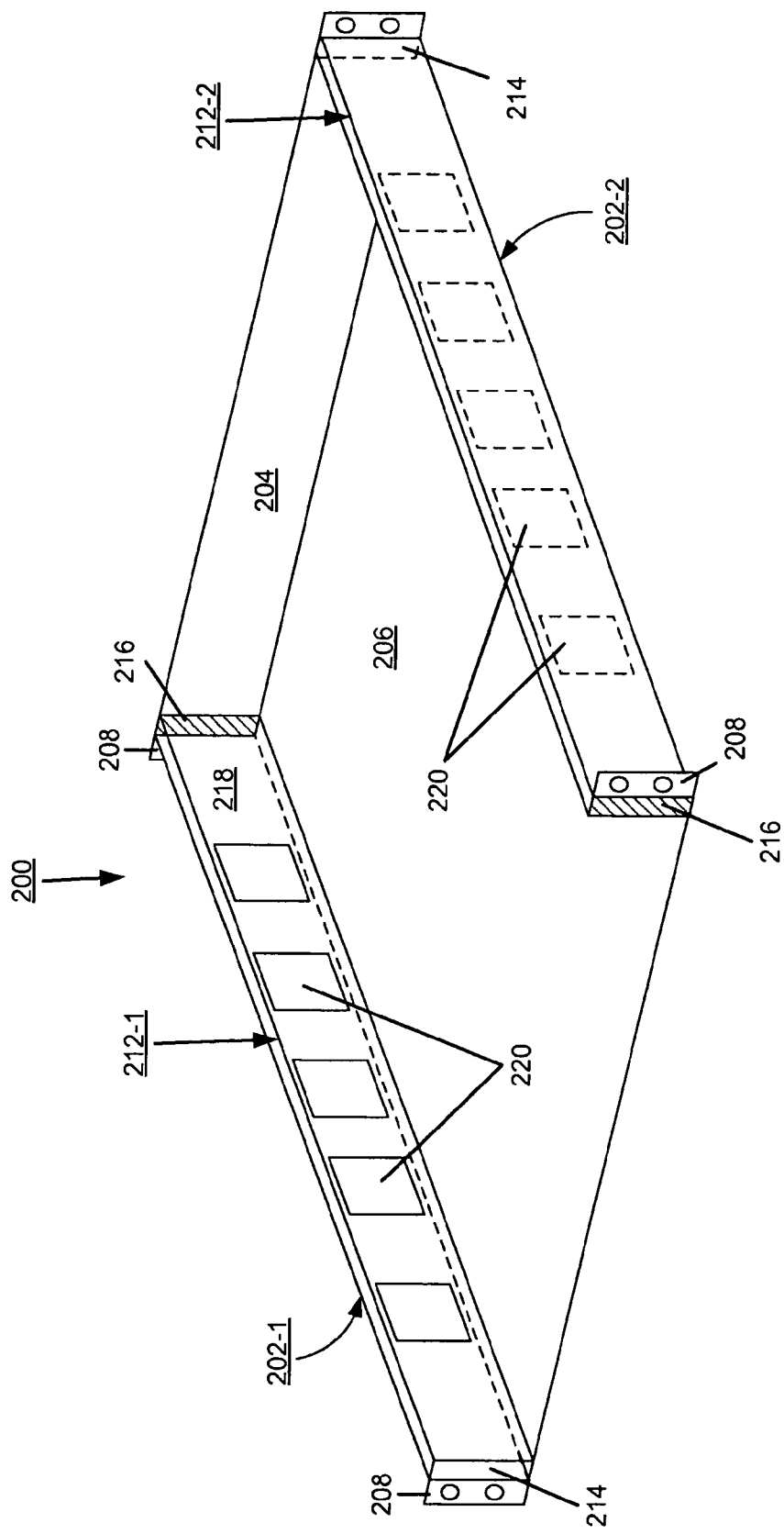
FIG. 14 is a diagrammatic representation of an embodiment of an equipment tray constructed in accordance with the invention.

FIG. 14 shows an embodiment of an equipment tray 200 having opposing sidewalls 202-1, 202-2 (generally, 202), a back wall 204, and a support surface 206 extending between the sidewalls 202 and back wall 204, for supporting a unit of electronic equipment. Extending substantially orthogonal from each end of a sidewall 202 is a mounting flange 208, for securing the equipment tray to four vertical rails of an equipment rack. Each sidewall 202-1, 202-2 has a respective integrated conduit 212-1, 212-2 (generally, 212). Each conduit 212 has an open end 214, a closed end 216, and a side 218 with a plurality of vents 220 formed therein.

The sides 218 of the conduits 212 can have gaskets (not shown) around their periphery. In general, the width of the support surface 206 of the equipment tray 200 is designed such that the unit of equipment sits tightly between the conduits 212 so that the gaskets can thus provide tight seals. Additionally, or alternatively, flexible flaps (biased to extend substantially orthogonal from the side 218 of the conduit) span any gap between the conduit and the sidewall of the equipment unit and serve as a duct for air flowing between the vents 220 and the vents 58 of the equipment sidewall 56.

While the invention has been shown and described with reference to specific preferred embodiments, it should be understood by those skilled in the art that various changes in form and detail may be made therein without departing from the spirit and scope of the invention as defined by the following claims.

What is claimed is:

1. An apparatus for changing a direction of a flow of air moving through an electronic equipment enclosure, the electronic equipment enclosure having a front wall, a back wall, opposing first and second sidewalls, and one or more fans that move air in a lateral direction through the electronic equipment enclosure, each of the opposing sidewalls of the electronic equipment enclosure having one or more vents through which air enters or exits the electronic equipment enclosure, the apparatus comprising:

a first conduit attached externally to one of the opposing sidewalls of the electronic equipment enclosure, the first conduit having an open end, a closed end opposite the open end, and a side having one or more vents, the one or more vents in the side of the first conduit being aligned with the one or more vents in the sidewall of the electronic equipment enclosure to which the first conduit is attached, the first conduit taking air in through the open end, channeling the air in a direction substantially orthogonal to the lateral direction of the air moving through the electronic equipment enclosure, and passing the air into the electronic equipment enclosure through the aligned vents;

a second conduit attached externally to the other of the opposing sidewalls of the electronic equipment enclosure, the second conduit having an open end, a closed end opposite the open end of the second conduit, and a side having one or more vents, the one or more vents in the side of the second conduit being aligned with the one or more vents in the sidewall of the electronic equipment enclosure to which the second conduit is attached, the second conduit receiving the air moved through the electronic equipment enclosure by way of the one or more vents in the side of the second conduit, channeling the air in a direction that is substantially orthogonal to the direction of the air moving through the electronic equipment enclosure, and exhausting the air through the open end of the second conduit; and a first side rail and a second side rail, each side rail having a first end and a second end, each end of each slide rail having a flange extending therefrom for mounting to a vertical rail of an equipment rack, and wherein the first conduit is integrated into the first side rail and the second conduit is integrated into the second side rail.

2. The apparatus of claim 1, wherein the side of each conduit has a gasket disposed around a periphery thereof, the gasket being pressed between the side of that conduit and the sidewall of the electronic equipment enclosure to which that conduit is externally attached.

3. The apparatus of claim 1, wherein the open end of the first conduit faces forward of the electronic equipment enclosure and the open end of the second conduit faces rearward of the electronic equipment enclosure.

4. The apparatus of claim 3, wherein the first conduit intakes air through the open end that faces forward of the electronic equipment enclosure and the second conduit exhausts air through the open end that faces rearward of the electronic equipment enclosure.

5. The apparatus of claim 3, wherein the first conduit exhausts air through the open end that faces forward of the electronic equipment enclosure and the second conduit intakes air through the open end that faces rearward of the electronic equipment enclosure.

6. An apparatus for changing a direction of a flow of air moving through an electronic equipment enclosure, the electronic equipment enclosure having a front wall, a back wall, opposing first and second sidewalls, and one or more fans that move air in a lateral direction through the electronic equipment enclosure, each of the opposing sidewalls of the electronic equipment enclosure having one or more vents through which air enters or exits the electronic equipment enclosure, the apparatus comprising:

a first conduit attached externally to one of the opposing sidewalls of the electronic equipment enclosure, the first conduit having an open end, a closed end opposite the open end, and a side having one or more vents, the one or more vents in the side of the first conduit being aligned with the one or more vents in the sidewall of the electronic equipment enclosure to which the first conduit is attached, the first conduit taking air in through the open end, channeling the air in a direction substantially orthogonal to the lateral direction of the air moving through the electronic equipment enclosure, and passing the air into the electronic equipment enclosure through the aligned vents;

a second conduit attached externally to the other of the opposing sidewalls of the electronic equipment enclosure, the second conduit having an open end, a closed end opposite the open end of the second conduit, and a side having one or more vents, the one or more vents in the side of the second conduit being aligned with the one or more vents in the sidewall of the electronic equipment enclosure to which the second conduit is attached, the second conduit receiving the air moved through the electronic equipment enclosure by way of the one or more vents in the side of the second conduit, channeling the air in a direction that is substantially orthogonal to the direction of the air moving through the electronic equipment enclosure, and exhausting the air through the open end of the second conduit; and an equipment tray having opposing first and second sidewalls, a support surface extending between the sidewalls of the equipment tray for holding the electronic equipment enclosure, and a mounting flange by which each sidewall of the equipment tray is secured to a vertical rail of an equipment rack, and wherein the first conduit is integrated into the first sidewall of the equipment tray and the second conduit is integrated into the second sidewall of the equipment tray.

7. The apparatus of claim 1, wherein each side rail includes a shelf portion that extends laterally from a bottom edge of that side rail, the shelf portions of the side rails cooperating to provide a shelf upon which to support the electronic equipment enclosure.

8. An apparatus for changing a direction of air flowing through an electronic equipment enclosure having a front wall, a back wall, and opposing first and second sidewalls, and one or more fans moving air through the electronic equipment enclosure in a lateral direction, one of the opposing sidewalls of the electronic equipment enclosure having one or more vents through which air enters or exits the electronic equipment enclosure, the apparatus comprising:
 a conduit attached externally to the one sidewall of the electronic equipment enclosure with the one or more vents, the conduit having an open end, a closed end opposite the open end, and a side having one or more vents, the one or more vents in the side of the conduit being aligned with the one or more vents in the sidewall of the electronic equipment enclosure to which the conduit is attached, the conduit channeling the air in a direction substantially orthogonal to the lateral direction of the air moving through the electronic equipment enclosure: and
 a first side rail and a second side rail, each side rail having a first end and a second end, each end of each side rail having a flange extending therefrom for mounting to a vertical rail of an equipment rack, and wherein the conduit is integrated into the one of the side rails.

9. The apparatus of claim 8, wherein the side of the conduit has a gasket disposed around a periphery thereof, the gasket being pressed between the side of the conduit and the sidewall of the electronic equipment enclosure to which the conduit is externally attached.

10. The apparatus of claim 8, wherein the open end of the conduit faces forward of the electronic equipment enclosure.

11. The apparatus of claim 10, wherein the conduit intakes air through the open end and the electronic equipment enclosure exhausts air through one or more vents in the back wall of the electronic equipment enclosure.

12. The apparatus of claim 10, wherein the electronic equipment enclosure intakes air through one or more vents in the back wall of the electronic equipment enclosure and the conduit exhausts air through the open end.

13. An apparatus for changing a direction of air flowing through an electronic equipment enclosure having a front wall, a back wall, and opposing first and second sidewalls, and one or more fans moving air through the electronic equipment enclosure in a lateral direction, one of the opposing sidewalls of the electronic equipment enclosure having one or more vents through which air enters or exits the electronic equipment enclosure, the apparatus comprising:
 a conduit attached externally to the one sidewall of the electronic equipment enclosure with the one or more vents, the conduit having an open end, a closed end opposite the open end, and a side having one or more vents, the one or more vents in the side of the conduit being aligned with the one or more vents in the sidewall of the electronic equipment enclosure to which the conduit is attached, the conduit channeling the air in a direction substantially orthogonal to the lateral direction of the air moving through the electronic equipment enclosure; and
 a mounting tray having opposing first and second sidewalls, a support surface extending between the sidewalls of the mounting tray for holding the electronic equipment enclosure, and a mounting flange by which each sidewall of the mounting tray is secured to a vertical rail of an equipment rack, and wherein the conduit is integrated into the one of the sidewalls of the mounting tray.

14. The apparatus of claim 8, wherein each side rail includes a shelf portion that extends laterally from a bottom edge of that side rail, the shelf portions of the side rails cooperating to provide a shelf upon which to support the electronic equipment enclosure.

* * * * *